(12) United States Patent
Shinmori

(10) Patent No.: US 6,584,540 B1
(45) Date of Patent: Jun. 24, 2003

(54) FLASH MEMORY REWRITING CIRCUIT FOR MICROCONTROLLER

(75) Inventor: Nobuaki Shinmori, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/448,298

(22) Filed: Nov. 24, 1999

(30) Foreign Application Priority Data

Dec. 28, 1998 (JP) .................................. 10-373187

(51) Int. Cl.[7] .............................................. G06F 12/00
(52) U.S. Cl. .................... 711/103; 710/23; 711/154; 711/165; 711/170; 712/37; 713/100
(58) Field of Search ........................... 710/5, 10, 23, 710/36, 104; 711/101, 102, 103, 154, 163, 165, 166, 170, 171, 172, 173; 712/37; 713/1, 2, 100; 714/6, 7, 710

(56) References Cited

U.S. PATENT DOCUMENTS

| | | | | |
|---|---|---|---|---|
| 5,590,303 A | * | 12/1996 | Shibata et al. | 365/185.33 |
| 5,603,001 A | * | 2/1997 | Sukegawa et al. | 711/103 |
| 5,822,581 A | * | 10/1998 | Christeson | 713/1 |
| 5,933,847 A | * | 8/1999 | Ogawa | 711/103 |
| 6,195,511 B1 | * | 2/2001 | Harada | 396/300 |
| 6,341,239 B1 | * | 1/2002 | Hayashi et al. | 700/79 |

* cited by examiner

Primary Examiner—Do Hyun Yoo
Assistant Examiner—Christian P. Chace
(74) Attorney, Agent, or Firm—Volentine Francos, PLLC

(57) ABSTRACT

A flash memory rewriting circuit capable of rewriting a flash ROM without Presenting any problem from the viewpoint of security of programs. In a transfer Program storing region of the flash ROM is stored a program to activate a CPU of a microcontroller and to transfer a rewriting data from external devices to peripherals. On a mask ROM is written, in a fixed manner, a program to activate a CPU and to write the rewriting data on a region other than the flash ROM. Because the program stored in the transfer program storing region is installed by users, no on except user can read or rewrite the program.

14 Claims, 6 Drawing Sheets

FLASH MEMORY REWRITING CIRCUIT FOR MICROCONTROLLER

BACKGROUND OF THE INVENTION

1. Field of the Invention

The present invention relates to a flash memory rewriting circuit to rewrite data of a flash memory embedded in a microcontroller (hereinafter referred to as a "micon").

2. Description of the Related Art

A micon is built in an electric product of a certain kind to control its operation. A manufacturer of electric products who manufactures and sells such electric products in which the micon is built in purchases the micon to be built in electric products from semiconductor manufacturers.

The micon is provided with a central processing unit (hereinafter referred to as a "CPU") and a memory in which an operating program defining operations of the CPU is stored. As a memory of such micons to be built in electric products, generally, a flash ROM is used, so that an electric product manufacturer being a user of the micon can write their own original programs suitable for each electric product in which the micon is built on the memory of the micon or can amend and/or change operating programs written on the memory.

To rewrite the operating program stored in the flash ROM, a method is conventionally available in which the micon itself is operated and rewriting of the flash ROM is controlled. Since this method allows the use of serial I/O devices mounted on peripheral circuits (hereafter referred to as a "peripheral"), a RAM (Random Access Memory) and the like, the number of terminals for interface with external devices can be small and, even after the implementation of the micon on a system board of electric products, the rewriting of the flash ROM is made possible. However, this method presents a problem in that, when the flash ROM is rewritten by the operation of the micon, if a rewriting program is simply stored in the flash ROM, while the rewriting of the operating program of the flash ROM is executed in accordance with the rewriting program, the CPU of the micon cannot read data from the flash memory and therefore the omission of input data to the CPU occurs, thus causing a run-away of the CPU. To solve this problem, a mask ROM and/or a RAM to be exclusively used to store a rewriting program are used conventionally as a flash memory rewriting circuit as shown in FIGS. 2 and 3.

FIG. 2 is a block diagram showing one example of a conventional flash memory rewriting circuit. FIG. 3 is a block diagram showing another example of a conventional flash memory rewriting circuit.

In general, the micon has a CPU 1, a RAM (not shown), peripherals 2 including serial I/O devices and the like constituting an input/output section used to serially input and output data, which is inputted or outputted to and from the CPU, to and from external devices, and a flash memory 3.

As shown in FIG. 2, in addition to these components described above, a mask ROM 4 is mounted on the micon to constitute a flash memory rewriting circuit. As depicted in FIG. 3, in addition to these components described above, a RAM 5 and a download circuit 6 are mounted on the micon. A rewriting program is stored in the mask ROM 4. Data stored in the mask ROM 4 and data stored in the flash. ROM 3 are selected by a selector 7 and read by the CPU 1. The RAM 5 shown in FIG. 3 stores the rewriting program fed through the download circuit 6. Data stored in the RAM 5 and data stored in the flash ROM 3 are selected also by a selector 7 and read by the CPU 1.

However, such conventional flash memory rewriting circuits as shown in FIGS. 2 and 3 present the following problems. That is, if such a mask ROM 4 as shown in FIG. 2 is used as a flash memory rewriting circuit, since the rewriting program is stored in the mask ROM 4, a method for transferring the rewriting data in accordance with the program is fixed. Therefore, to change the content stored in the mask ROM 4, it is necessary to rebuild the micon and to change the rewriting program stored in the mask ROM 4. Moreover, since the rewriting program stored in the mask ROM is fixed in accordance with each electrical product, a third party can easily read or rewrite the data stored in the flash ROM 3, presenting a problem from the viewpoint of security of the program. That is, contents of the rewriting program containing the data transfer program stored in the mask ROM 4 have been publicized so that each user can write an original operating program in accordance with characteristics of electric products into which the program is installed. Because of this, detailed contents of the rewriting program can be known from the publicized information and, as a result, an originally designed operating program stored in the flash ROM can be comparatively easily read by a third party.

On the other hand, if such a RAM 5 as shown in FIG. 3 is used, both the download circuit 6 to download the rewriting program and an interface circuit to transfer the rewriting data to the flash ROM 3 have to be mounted on the system of users. When the rewriting program is downloaded to this RAM 5, since a third party also can easily create the rewriting program, reading or rewriting of data stored in the flash ROM can be also made easy, presenting a problem from the viewpoint of security of programs. That is, detailed procedures for downloading to the download circuit 6 have been publicized so that each user can write an original operating program in accordance with characteristics of electric products into which the program is installed. Because of this, by knowing the publicized procedure, the rewriting program itself stored in the RAM 5 can be easily written and, as a result, the operating program stored in the flash ROM can be also comparatively easily read out by a third party.

SUMMARY OF THE INVENTION

In view of the above, it is an object of the present invention to provide a flash memory rewriting circuit which does not cause a reduction in maintaining the security of an operating program. It is another object of the present invention to provide a flash memory rewriting circuit wherein there is no need for newly mounting a purpose-built RAM or a ROM for rewriting of the flash memory.

According to a first aspect of the present invention, there is provided a flash memory rewriting circuit being integrated into a microcontroller having a CPU, a flash memory in which an operating program defining an operation of said CPU is stored and an input/output section to input and output data from and to external devices in order to rewrite, by operations of the CPU, the operating program stored in the flash memory, comprising:

a transfer program storing region provided, within the flash memory, in a memory region other than an operating program storing region in which the operating program is stored, which also stores a data transfer program to transfer a data for rewriting the operating program to the flash memory through the external devices when the data transfer program is read and executed by the CPU; and a read only memory storing a rewriting execution program to have rewriting data fed by external devices written on the operating program storing region of the flash memory when the rewriting execution program is read and executed by the CPU.

In the foregoing, a preferable mode is one wherein the data transfer program contains a portion of a program to instruct the CPU to read the rewriting execution program stored in the read only memory.

Also, a preferable mode is one wherein the data transfer program is directly written on the data transfer program storing region of the flash memory without the use of the CPU.

Also, a preferable mode is one wherein the micon is mounted on a system board fitted to electrical products for controlling operations of the same and the writing of the data transfer program is carried out prior to the implementation of the micon to the system board.

Also, a preferable mode is one wherein the writing of the data transfer program on the data transfer program region is performed by users who purchase the micon and build it into the electric products.

Also, a preferable mode is one wherein the micon is provided with a selector used to cause the CPU to selectively access the read only memory and the flash memory.

Also, a preferable mode is one wherein the flash memory rewriting circuit is provided with a rewrite inhibiting circuit used to inhibit the rewriting of the data transfer program caused by run-away of the CPU.

Also, a preferable mode is one wherein the rewrite inhibiting circuit inhibits the transfer of data having an address designating the transfer program storing region of the flash memory to the flash memory.

Furthermore, a preferable mode is one wherein the rewrite inhibiting circuit is disposed between the CPU and the flash memory.

According to a second aspect of the present invention, there is provided a flash memory rewriting circuit being integrated into a micon having a CPU, a flash memory in which an operating program defining an operation of the CPU is stored and an input/output section to input and output data to and from external devices in order to rewrite, by operations of the CPU, the operating program stored in the flash memory, comprising:

a rewriting program storing region provided, within the flash memory, in a memory region other than an operating program storing region in which the operating program is stored, which also stores a rewriting program to read rewriting data for rewriting of the operating program from external devices through the input/output section when the rewriting program is read and executed by the CPU; and a write controlling circuit disposed between the CPU and the flash memory to be operated in synchronization with clocks of the CPU, which receives (more than one) rewriting signals used to rewrite the operating program on the operating program storing region of the flash memory by the execution of the rewriting program through the use of the CPU and which rewrites the rewriting data on the operating program storing region after receiving a rewriting execution signal from the CPU and, during the execution of the rewriting, sends out a standby requesting signal to the CPU to prevent run-away of the CPU.

In the foregoing, it is preferable that the rewriting program is directly written on the rewriting program storing region of the flash memory without the use of the CPU.

Also, it is preferable that the micon is mounted on a system board fitted to electrical products for controlling operations of the same and the writing of the rewriting program is carried out prior to the implementation of the micon to said system board.

Also, it is preferable that the writing of the rewriting program on the rewriting program storing region is performed by users who purchase the micon and build it into the electric products.

Furthermore, it is preferable that the write controlling circuit is comprised of a register to read the rewriting data through the execution of the rewriting program by the CPU, a register to read a specified address for the rewriting data and a standby signal generating circuit to return the standby requesting signal to cause the access of the CPU to the flash memory to wait when receiving the rewriting execution signal from the CPU.

BRIEF DESCRIPTION OF THE DRAWING

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

First Embodiment

Figure 1:
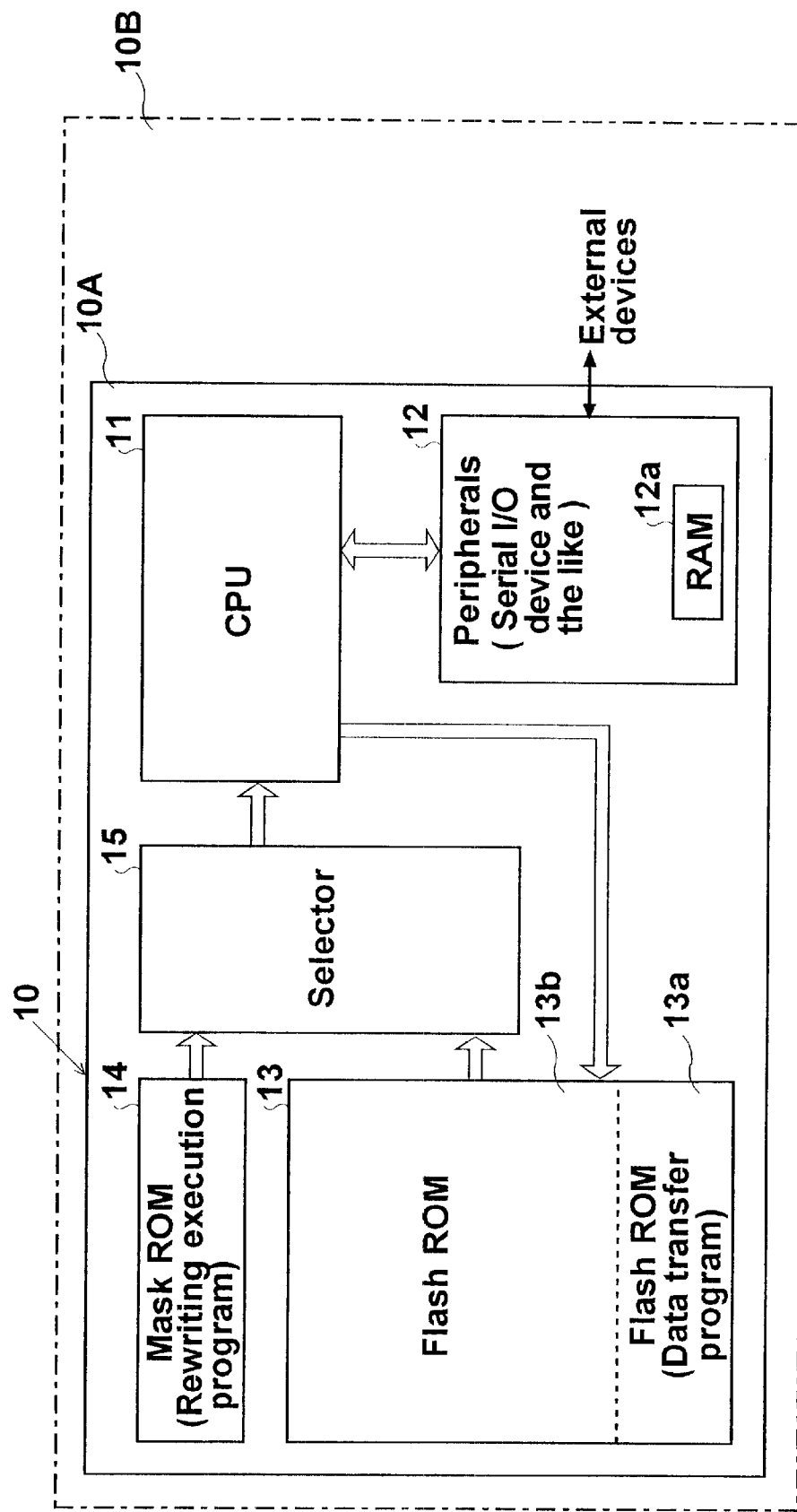
FIG. 1 is a block diagram showing a flash memory rewriting circuit according to a first embodiment of the present invention.
Figure 2:
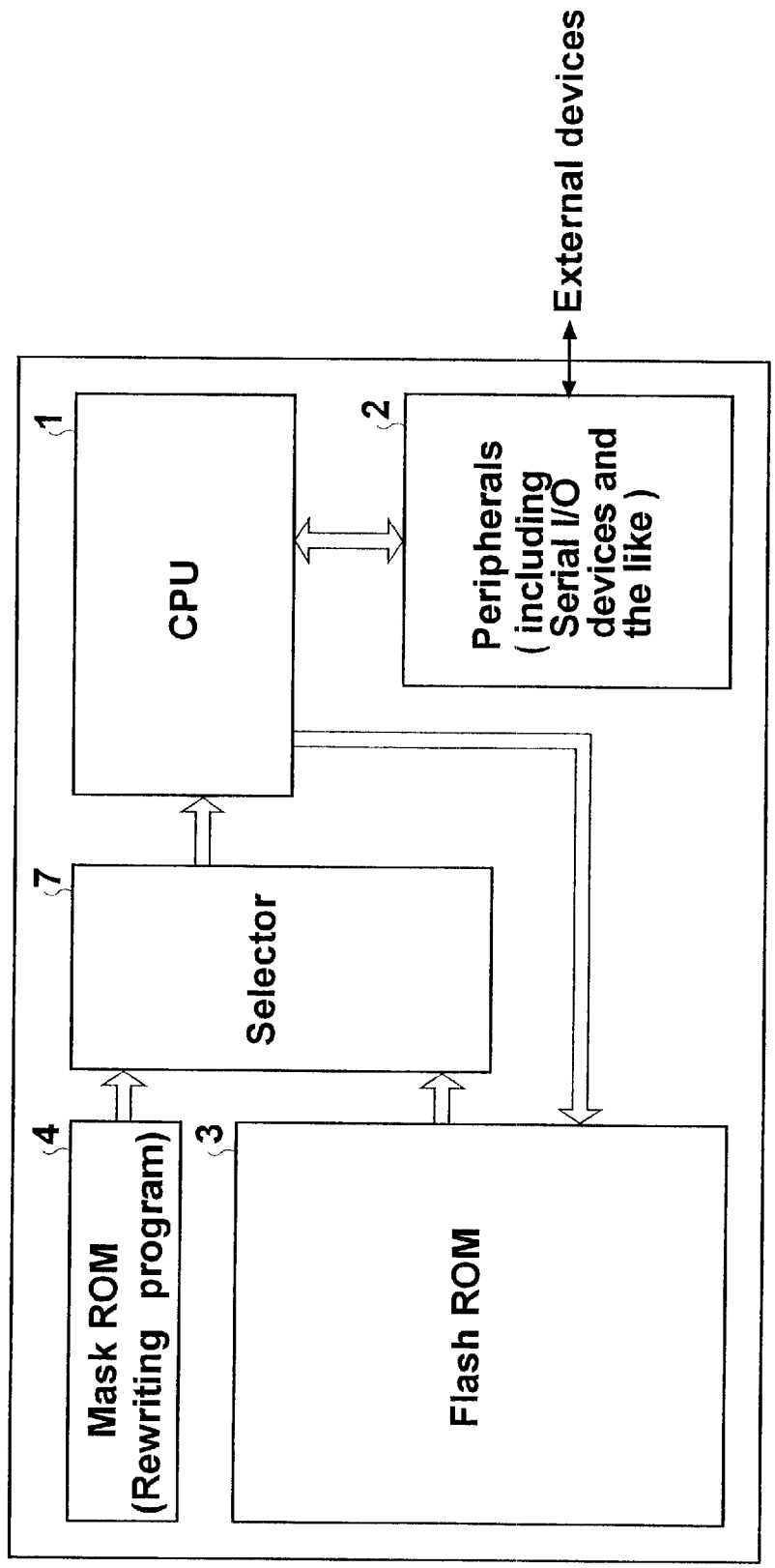
FIG. 2 is a block diagram illustrating one example of a conventional flash memory rewriting circuit.
Figure 3:
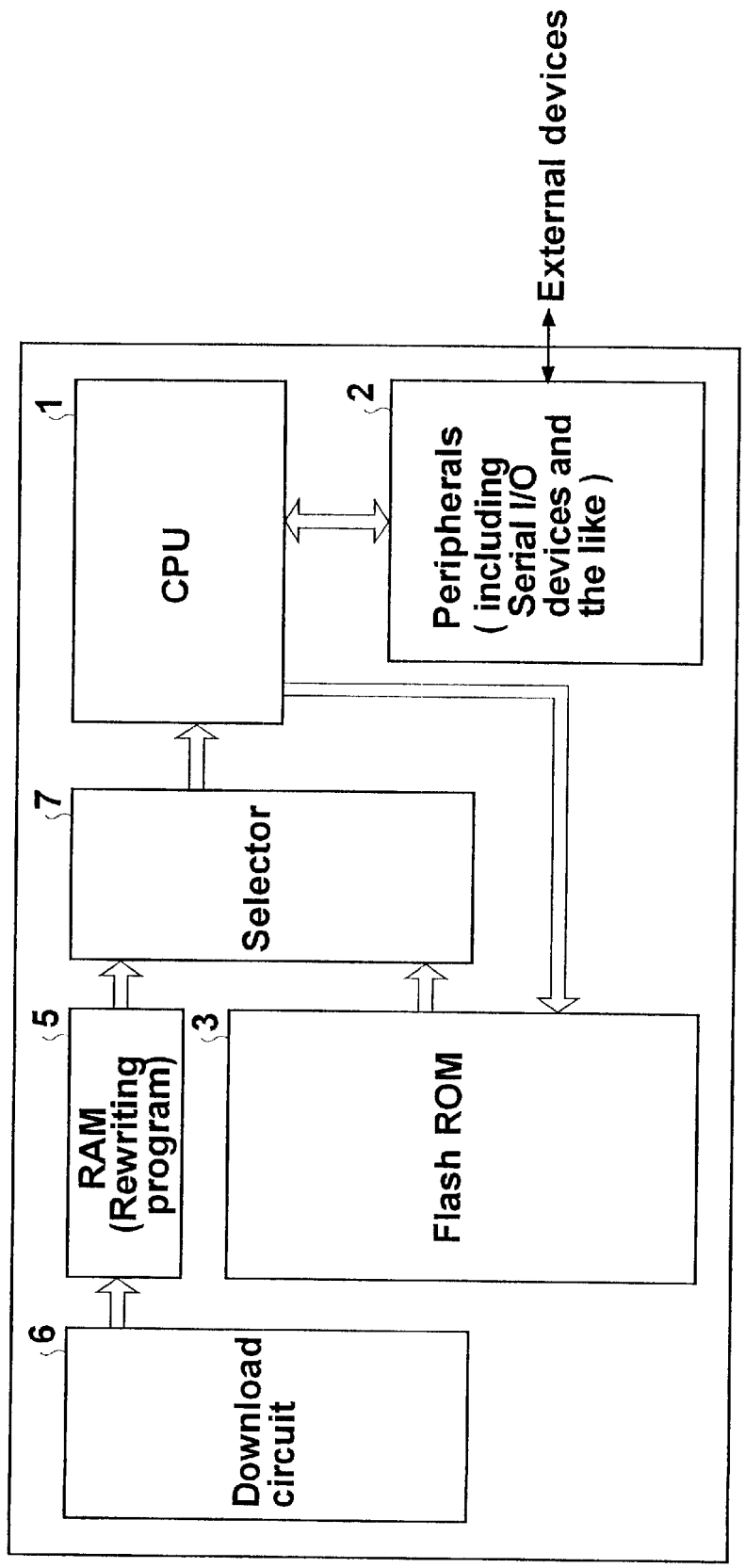
FIG. 3 is a block diagram illustrating another example of a conventional flash memory rewriting circuit.

FIG. 1 is a block diagram showing a flash memory rewriting circuit according to a first embodiment of the present invention.

The flash memory rewriting circuit 10 is mounted on a micon 10A having a CPU 11, peripherals 12 (including serial I/O devices and the like) serving as an input/output section to input and output data of the CPU 11 to and from external devices, a RAM 12*a*, and a flash ROM 13 being a flash memory. The flash memory rewriting circuit 10 is provided with a transfer program storing region 13*a* disposed at a part of the flash ROM 13 and a mask ROM 14. The micon 10A is installed on a system board 10B of an electric product to electrically control the same. In the transfer program storing region 13*a* is stored a data transfer program used to activate the CPU 11 to transfer rewriting data from external devices to input/output sections of the peripherals in order to rewrite data of the flash ROM 13. The data transfer program contains a program to instruct the CPU to read a rewriting execution program stored in the mask ROM 14. The mask ROM 14 contains a rewriting execution program used to have rewriting data transferred to the input/output section written on a memory region (i.e., an operating program storing region) other than a transfer program storing region 13a of the flash ROM 13. The rewriting data is transferred from the CPU 11 to the flash ROM 13, and data stored in the storing region 13 of the flash ROM 13 and data stored in the mask ROM are selected depending on the execution of the operating program or of the rewriting execution program and the selected data is read out by the CPU.

Next, operations of the flash memory rewriting circuit of the first embodiment are hereinafter described.

Contents, by product, written on the mask ROM 14 are fixed. On the other hand, the data transfer program is written on the data transfer program storing region 13a of the flash ROM, directly and without the use of operations of the CPU, from a data terminal, an address terminal and a control terminal mounted on the flash ROM before the implementation of the micon 10A on the system board 10B. Then, the micon 10A, after being installed in the system board 10B, is operated.

When contents stored in the memory region 13b of the flash ROM 13 are rewritten as necessary, the CPU 11 is used to read the data transfer program stored in the transfer program storing region 13a. The CPU 11 is operated on the basis of the data transfer program to input rewriting data into the input/output section from external devices and then to read out the rewriting execution program from the mask ROM 14.

The CPU is operated on the basis of the read-out rewriting execution program to transfer the rewriting data from the peripherals and to write it on the memory region 13b of the flash ROM 13. The rewriting of the flash ROM 13 is now completed.

As described above, according to a first embodiment, the flash memory rewriting circuit is constructed by the transfer program storing region 13a mounted on the memory region of the flash ROM and by the mask ROM 14, the number of interface signals required for rewriting the flash ROM is small and a download circuit and the like are not required. The CPU is operated in accordance with the data transfer program stored in the transfer program storing region of the flash memory and the rewriting data is transferred to the input/output section. Also, the CPU is operated in accordance with the rewriting execution program stored in the mask ROM and the rewriting data transferred to the input/output section is written on the flash memory. This means that downloading is not required and the rewriting is performed by both the data transfer program stored separately and rewriting execution program. Moreover, any user may select arbitrarily, by using the data transfer program, a method for transferring rewriting data for rewriting the flash ROM. This means that the flexibility of system design increases. In addition, each of the data transfer program is individually installed by users which cannot be easily known to any third party. Therefore, since the data transfer program is known only by a user who has written the program, no problem from the viewpoint of security occurs. Furthermore, since the rewriting execution program is given directly from the mask ROM. 14 to the CPU 11, the omission of inputting of data to the CPU, 11, during the writing operation, does not occur, thus preventing the CPU 11 from running away due to the omission of data. Accordingly, even if the operating program should be rewritten because of the run-away of the CPU, as the data transfer program is protected, the wrongly rewritten operating program can be rewritten so as to be correct in accordance with ordinary procedures of rewriting operating programs, thus making the micon restored to normal state.

Second Embodiment

Figure 4:
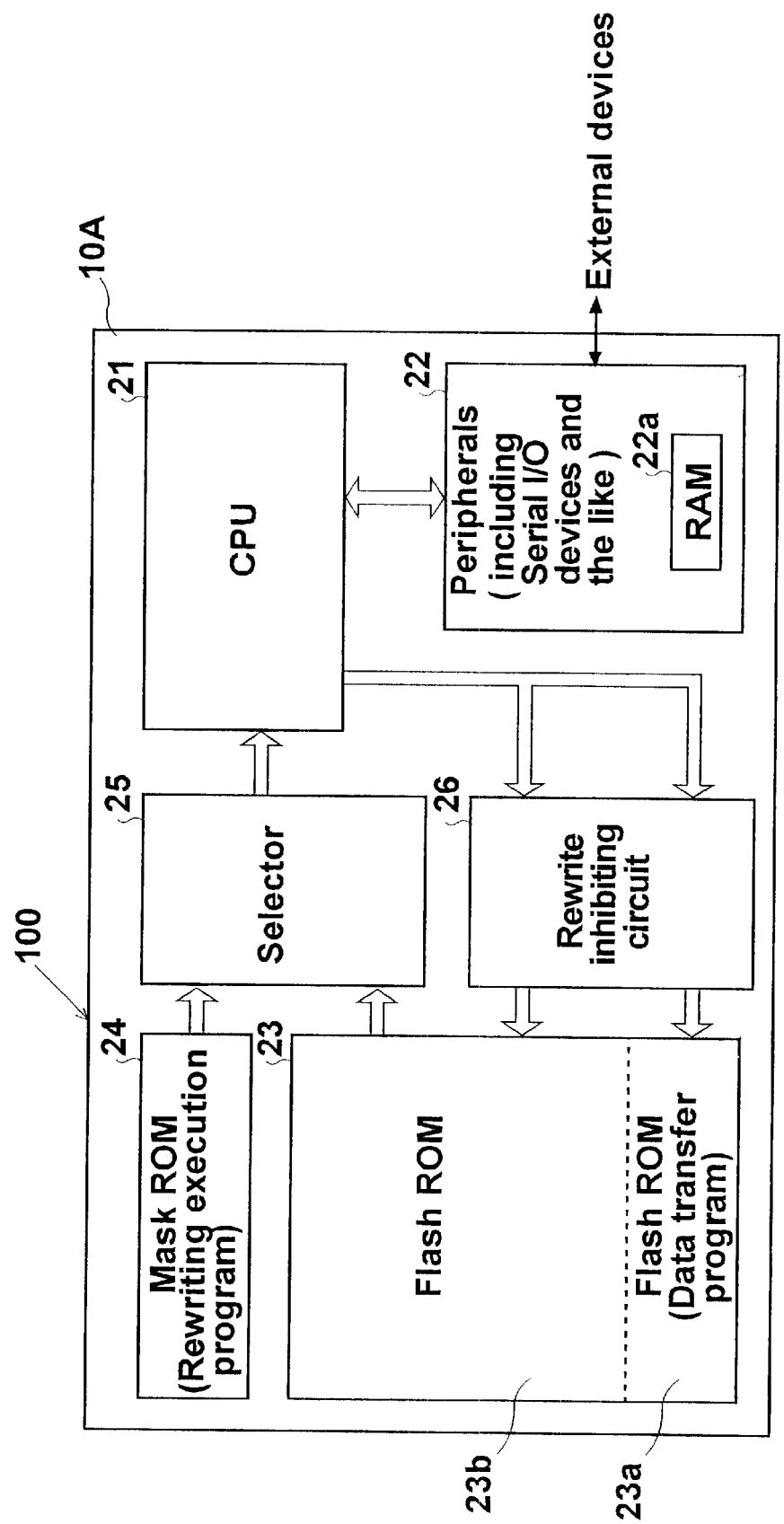
FIG. 4 is a block diagram showing a flash memory rewriting circuit according to a second embodiment of the present invention.

FIG. 4 is a block diagram showing a flash memory rewriting circuit according to a second embodiment of the present invention.

The flash memory rewriting circuit 100 is mounted on a micon 10A having a CPU 21, peripherals 22 (including serial I/O devices and the like) serving as an input/output section to input and output data of the CPU 21 to and from external devices, a RAM 22a and a flash ROM 23 being a flash memory. The flash memory rewriting circuit 100 has a transfer program storing region 23a disposed at a part of the flash ROM 23 and a mask ROM 24. In addition to these, a rewrite inhibiting circuit 26 is newly mounted on the flash memory rewriting circuit 100.

As in the first embodiment, a data transfer program is stored in the transfer program storing region 23a. The mask ROM 24 contains a rewriting execution program used to have rewriting data transferred to the peripherals 22 written on a memory region (i.e., an operating program storing region) other than the transfer program storing region 23a of the flash ROM 23. Between the CPU 21 and the transfer program storing region 23a of the flash ROM 23 is connected the rewrite inhibiting circuit 26, and the rewriting data is fed from the CPU 21 to a memory region 23b of the flash ROM only.

The transfer program storing region 23a and the operating program storing region are individually specified and partitioned by addresses assigned to each of them. The operating program to be stored in the operating program storing region is rewritten, as necessary, by operations of the CPU 21. On the other hand, as described in the first embodiment, the data transfer program to be stored in the transfer program storing region 23a is directly and in advance written in the flash ROM and further rewriting is not required.

Even if data having an address of the transfer program storing region 23a, out of data to be transferred to the flash ROM 23 from the CPU 21 through the rewrite inhibiting circuit 26, is wrongly transferred from the CPU 21 to the rewrite inhibiting circuit 26, because an address signal specifying an address to be stored provides a filtering action to the rewrite inhibiting circuit 26 so as to inhibit the passage of data having the address of the transfer program storing region 23a, the passage of the data to the flash ROM 23 is inhibited by the circuit 26. Accordingly, the rewriting of contents of the data transfer program that should not be rewritten can be surely prevented.

As in the first embodiment, data stored in the memory region 23b of the flash ROM 23 and in the mask ROM 24 are selected and read out by the CPU 21.

The micon 10A is acted on by the flash memory rewriting circuit 100 shown in FIG. 4 in the same manner as in the first embodiment, causing data stored in the memory region 23b of the flash ROM 23 to be rewritten. Since the rewrite inhibiting circuit 26 is adapted to inhibit the writing on the transfer program storing region 23a, the rewriting of the data transfer program does not take place.

Thus, according to the second embodiment, since the flash memory rewriting circuit is provided with the rewrite inhibiting circuit 26, even if the micon should run away, there is never a case where the data transfer program stored in the transfer program storing region 23b is rewritten. This ensures that stable and safer rewriting of the flash ROM is performed.

Third Embodiment

Figure 5:
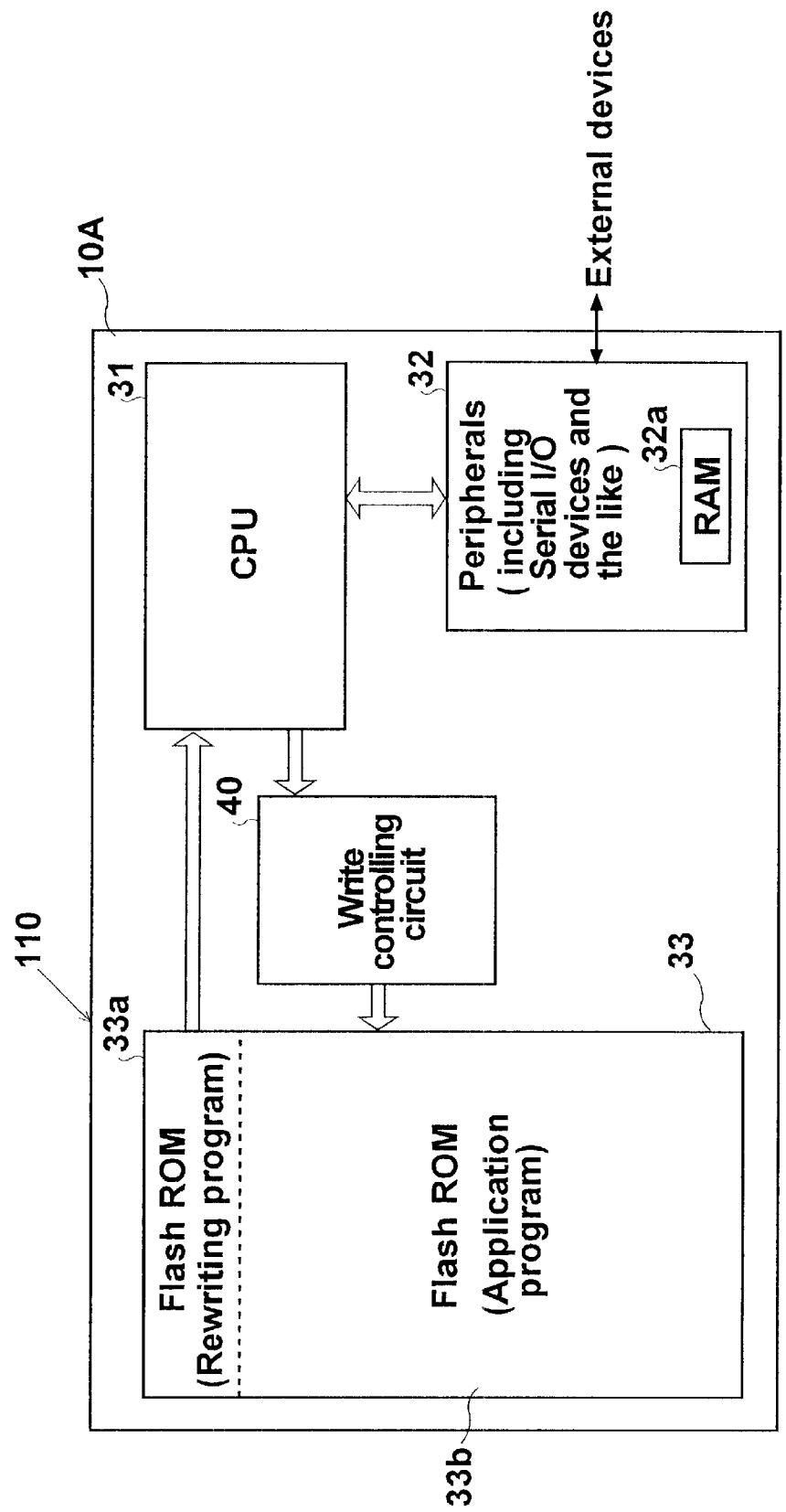
FIG. 5 is a block diagram showing a flash memory rewriting circuit according to a third embodiment of the present invention.

FIG. 5 is a block diagram showing a flash memory rewriting circuit according to a third embodiment of the present invention.

The flash memory rewriting circuit 110 is mounted on a micon 10A having a CPU 31, peripherals 32 (including serial I/O devices and the like) serving as an input/output section to input and output, serially, data of the CPU 11 to and from external devices, a RAM 32a and a flash ROM 33 being a flash memory. The flash memory rewriting circuit is provided with a rewriting program storing region 33a disposed at a part of the flash ROM 33 and a write controlling circuit 40. Application programs and the like are held in an operating program storing region 33b other than a rewriting program storing region 33a of the flash ROM 33.

Figure 6:
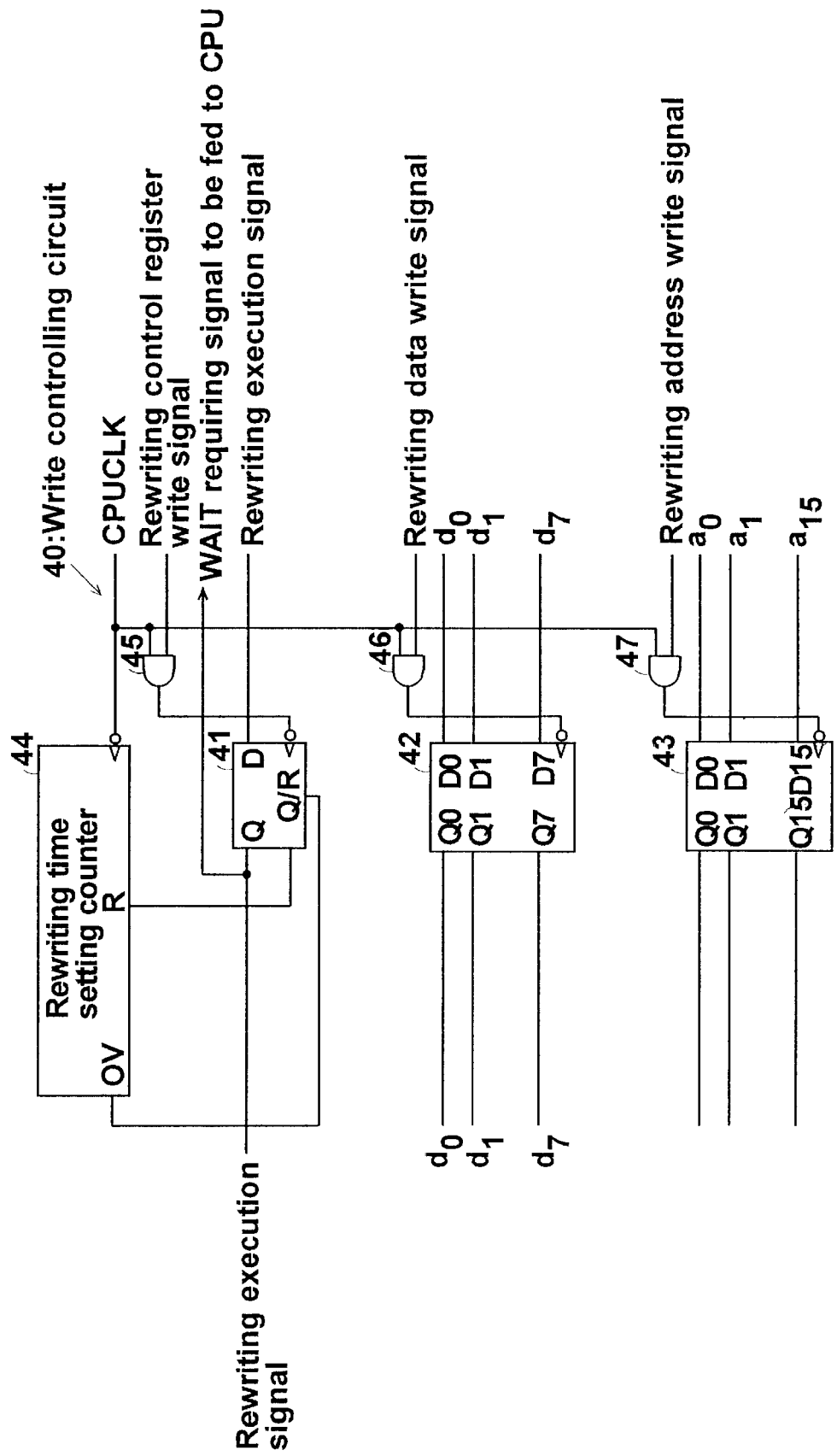
FIG. 6 is a block diagram showing a write controlling circuit shown in FIG. 5.

FIG. 6 is a block diagram showing the write controlling circuit 40 illustrated in FIG. 5.

The write controlling circuit 40 is a circuit to perform the rewriting of, for example, a 64K-byte flash ROM 33 in one byte (8 bits) by using a control signal produced by hardware, instead of activating the CPU 31 and controlling, by software, the writing of the flash ROM, and which has a flip-flop 41 being a standby signal generating circuit, a register 42 to hold multiple data fed from the inputting section and to output them to a data inputting terminal of the flash ROM 3, a register 43 to hold addresses corresponding to data stored in the register 42 and to feed them to an address inputting terminal of the flash ROM and rewriting time setting counter 44.

To a clock terminal of a flip-flop 41 is connected an AND gate 45 through which a clock CPUCLK is allowed to pass when a rewriting control register write signal outputted by the CPU 31 is valid. To a clock terminal of a register 42 is connected an AND gate 46 through which a clock CPUCLK is allowed to pass when a rewriting data write signal outputted by the CPU 31 is valid as well. To a clock terminal of a register 43 is connected an AND gate 47 through which a clock CPUCLK is allowed to pass when a rewriting address write signal outputted from the CPU 31 is valid.

The rewriting time setting counter 44 is adapted to count the number of clocks CPUCLK. To a reset terminal R of this counter 44 is connected an inverting output terminal Q/R of the flip-flop 41 and to an overflow output terminal (OV) of the counter 44 is connected a reset terminal R of the flip-flop 41.

Next, operations of the flash memory rewriting circuit of the third embodiment are hereinafter described.

As in the first embodiment, in the rewriting program storing region 33a of the flash ROM 33 is written the rewriting program prior to the implementation of a micon 10A on a system board. Then, after the micon 10A is implemented on the system board, the micon 10A is operated.

When contents stored in the memory region 33b of the flash ROM 33 are rewritten as necessary, the CPU 31 is used to read the rewriting program stored in the rewriting program storing region 33a. The CPU 31 operates according to the rewriting program, inputs, from external devices, rewriting data $d_0, d_1, \ldots, d_7$ serially, to a RAM 32a of an input/output section 32 and then makes valid the rewriting data write signal. This causes rewriting data $d_0, d_1, \ldots, d_7$ to be set in synchronization with the clock CPUCLK. Similarly, the CPU 31 operates according to the rewriting program, inputs, from external devices, addresses $a_0, a_1, \ldots, a_{15}$, serially to a RAM 32a of an input/output section 32 and then makes valid the rewriting data write signal. This causes addresses $a_0, a_1, \ldots, a_{15}$ to be set in synchronization with the clock CPUCLK.

Next, the CPU 31 makes valid the rewriting execution signal and outputs it, and also makes valid the rewriting control register write signal and outputs it. The flip-flop 41 latches the rewriting execution signal in synchronization with the clock CPUCLK and outputs it to the flash ROM 33. The rewriting execution signal outputted by the flip-flop 41 is fed to the flash ROM 33, and the rewriting data $d_0, d_1, \ldots, d_7$ outputted by the register 42 is written at positions specified by addresses $a_0, a_1, \ldots, a_{15}$ of the flash ROM. The rewriting execution signal outputted by the flip-flop 41 is fed to the CPU 31 as a WAIT requiring signal causing the CPU 31 to wait before access to the flash ROM 33.

The rewriting time setting counter 44 counts the number of clocks CPUCLK and, after completing the writing of data stored in the register 42 on the flash ROM, it feeds its overflow to the flip-flop 41. Then, the flip-flop 41 is reset to stop the outputting of the rewriting execution signal and the WAIT requiring signal. When the outputting of the WAIT requiring signal is stopped, the CPU starts the transfer of new 8 bit writing data to the register 42 and of addresses to the register 43, respectively. Thus, by effecting a series of operations, application programs stored in the flash ROM 33 are rewritten.

As described above, according to the third embodiment, because the rewriting program storing region 33a holding the rewriting program is installed in the flash ROM 33 and further the flip-flop 41 producing the WAIT requiring signal and the write controlling circuit 40 having the register 42 are mounted, the rewriting of application programs is made possible without the risk of the run-away of the CPU 31. This also eliminates the need for having a mask ROM, a RAM, a download circuit or the like other than the flash ROM 33 and, as a result, it is possible to construct a micon on a small chip area.

It is apparent that the present invention is not limited to the above embodiments but may be changed and modified without departing from the scope and spirit of the invention. For example, in the third embodiment, it is shown that rewriting of the 64K-byte flash ROM is executed in one-byte (8 bits), however, the capacity of the flash ROM or its rewriting method are not limited to the example described above.

As described previously, according to the first embodiment, since the flash memory rewriting circuit is comprised of the transfer program storing region provided at a part of the memory region of the flash memory to store the data transfer program installed by users and used to activate the CPU to transfer the rewriting data to the input/output section and a read only memory (ROM) storing the rewriting execution program used to activate the CPU to write the rewriting data transferred to the input/output section in the memory region other than the transfer program storing region of the flash memory also installed at the part of the memory region of the flash memory, the number of interface signals for rewriting the flash memory can be made small and the download circuits or the like are not required. Moreover, the method for transferring the rewriting data used to rewrite the flash memory can be set arbitrarily by users, thus increasing flexibility in system design and eliminating any problem from the viewpoint of security of program.

According to the second embodiment, since the rewrite inhibiting circuit to inhibit the writing on the transfer program storing region is provided, even if the micon runs away, the data transfer program is not rewritten, thus allowing the stable and safe rewriting of the flash memory.

According to the third embodiment, the flash memory rewriting circuit is provided, at a part of the memory region of the flash memory, to store the rewriting program installed by users, with the rewriting program storing region and the standby signal generating circuit to produce the signal to cause the access of the CPU to the flash memory to wait, the mask ROM, RAM or download circuits other than the flash memory are not required, thus enabling the micon to be miniaturized.

What is claimed is:

1. A flash memory rewriting circuit being integrated into a microcontroller having a CPU, a flash memory in which an operating program defining an operation of said CPU is stored and an input/output section to input and output data to and from external devices in order to rewrite, by operations of said CPU, said operating program stored in said flash memory, comprising:

a transfer program storing region provided, within said flash memory, in a memory region other than an operating program storing region in which said operating program is stored, which stores a data transfer program to transfer a data for rewriting said operating program to said flash memory through said external devices when said data transfer program is read and executed by said CPU; and a read only memory storing a rewriting execution program to have rewriting data fed by external devices written on said operating program storing region of said flash memory when said rewriting execution program is read and executed by said CPU.

2. The flash memory rewriting circuit according to claim 1 wherein said data transfer program contains a portion of a program to instruct said CPU to read said rewriting execution program stored in said read only memory.

3. The flash memory rewriting circuit according to claim 1 wherein said data transfer program is directly written on said data transfer program storing region of said flash memory without the use of said CPU.

4. The flash memory rewriting circuit according to claim 3 wherein said microcontroller is mounted on a system board fitted to electrical products for controlling operations of the same and the writing of said data transfer program is carried out prior to mounting of said microcontroller to said system board.

5. The flash memory rewriting circuit according to claim 4 wherein said writing of said data transfer program on said data transfer program region is performed by users who purchase said microcontroller and build it into said electric products.

6. The flash memory rewriting circuit according to claim 1 wherein said microcontroller is provided with a selector used to cause said CPU to selectively access said read only memory and said flash memory.

7. The flash memory rewriting circuit according to claim 3 wherein said flash memory rewriting circuit is provided with a rewrite inhibiting circuit used to inhibit the rewriting of said data transfer program caused by run-away of said CPU.

8. The flash memory rewriting circuit according to claim 7 wherein said rewrite inhibiting circuit inhibits the transfer of data having an address designating said transfer program storing region of said flash memory to said flash memory.

9. The flash memory rewriting circuit according to claim 8 wherein said rewrite inhibiting circuit is disposed between said CPU and said flash memory.

10. A flash memory rewriting circuit being integrated into a microcontroller having a CPU, a flash memory in which an operating program defining an operation of said CPU is stored and an input/output section to input and output data to and from external devices in order to rewrite, by operations of said CPU, said operating program stored in said flash memory, comprising:

a rewriting program storing region provided, within said flash memory, in a memory region other than an operating program storing region in which said operating program is stored, which stores a rewriting program to read a rewriting data for rewriting of said operating program from external devices through said input/output section when said rewriting program is read and executed by said CPU; and a write controlling circuit disposed between said CPU and said flash memory to be operated in synchronization with clocks of said CPU, which receives more than one rewriting signal used to rewrite said operating program on said operating program storing region of said flash memory by the execution of said rewriting program through the use of said CPU and which rewrites said rewriting data on said operating program storing region after receiving a rewriting execution signal from said CPU and, during the execution of said rewriting, sends out a standby requesting signal to said CPU to prevent run-away of said CPU.

11. The flash memory rewriting circuit according to claim 10 wherein said rewriting program is directly written on said rewriting program storing region of said flash memory without the use of said CPU.

12. The flash memory rewriting circuit according to claim 11 wherein said microcontroller is mounted on a system board fitted to electrical products for controlling operations of the same and the writing of said rewriting program is carried out prior to mounting of said microcontroller to said system board.

13. The flash memory rewriting circuit according to claim 12 wherein said writing of said rewriting program on said rewriting program region is performed by users who purchase said microcontroller and build it into said electric products.

14. The flash memory rewriting circuit according to claim 10 wherein said write controlling circuit is comprised of a first register that provides said rewriting data to said flash memory through the execution of said rewriting program by said CPU, a second register that provides a specified address to said flash memory for said rewriting data, and a standby signal generating circuit to return said standby requesting signal to cause the access of said CPU to said flash memory to wait when receiving said rewriting execution signal from said CPU.

* * * * *